United States Patent [19]

Harris et al.

[11] Patent Number: 5,663,580
[45] Date of Patent: Sep. 2, 1997

[54] OPTICALLY TRIGGERED SEMICONDUCTOR DEVICE

[75] Inventors: Christopher Harris, Sollentuna; Mietek Bakowski, Skultuna, both of Sweden

[73] Assignee: ABB Research Ltd., Zurich, Switzerland

[21] Appl. No.: 616,296

[22] Filed: Mar. 15, 1996

[51] Int. Cl.[6] ............................ H01L 29/74; H01L 31/111
[52] U.S. Cl. .................... 257/77; 257/84; 257/103; 257/113; 257/114; 257/116
[58] Field of Search ....................... 257/85, 84, 94, 257/96, 97, 103, 77, 76, 113, 114, 116

[56] References Cited

U.S. PATENT DOCUMENTS

| | | | |
|---|---|---|---|
| 4,985,742 | 1/1991 | Pankove | 257/77 X |
| 5,387,804 | 2/1995 | Suzuki et al. | 257/77 |
| 5,432,808 | 7/1995 | Hatano et al. | 257/77 X |

FOREIGN PATENT DOCUMENTS

| | | | |
|---|---|---|---|
| 0406506 | 1/1991 | European Pat. Off. | 257/85 |
| 4-167477 | 6/1992 | Japan | 257/77 |
| 5048145 | 2/1993 | Japan | 257/77 |
| WO95/05006 | 2/1995 | WIPO . | |

OTHER PUBLICATIONS

Grekhov, New Methods Of High-Power Fast Switching By Semiconductor Devices, 1995, Allerton Press, pp. 35-40.
Roggwiler et al., Totally Light Controlled Switch And New Means For Electrical Turn-off Of Thyristors, 1980 IEEE, pp. 646-648.
Watanabee et al., A 115-mm ø6-kV 2500-A Light-Triggered Thyristor, IEEE Transactions on Electron Devices, vol. 37, No. 1, Jan. 1990, pp. 285-289.

*Primary Examiner*—William Mintel
*Attorney, Agent, or Firm*—Pollock, Vande Sande & Priddy

[57] ABSTRACT

A semiconductor device comprises a semiconductor layer of SiC having an active area through which the device is adapted to be triggered by light incident thereon and means for generating and emitting light with an energy exceeding the bandgap, being the energy difference between the conduction band and the valence band, of the SiC-layer of the active area. The generating means is directly integrated in the device by being placed so as to cover substantial portions of the active area, and being made of a Group 3B-nitride having a larger bandgap that of the SiC of the SiC-layer.

16 Claims, 3 Drawing Sheets

OPTICALLY TRIGGERED SEMICONDUCTOR DEVICE

TECHNICAL FIELD OF THE INVENTION AND PRIOR ART

The present invention relates to a semiconductor device comprising a semiconductor layer of SiC having an active area through which the device is adapted to be triggered by light incident thereon and means for generating and emitting light with an energy exceeding the bandgap, i.e. the energy difference between the conduction band and the valence band, of the SiC-layer of said active area.

Such a semiconductor device may be any type of switching device, such as a thyristor, which may be optically triggered, but also other devices, such as diodes, are included in the definition of these semiconductor devices, so that "triggered by light" is to be interpreted to cover also the case in which the light will cause a current to flow through a semiconductor device as long as it is there, such as a light-activated diode.

The invention also includes a simple, fast, optically controlled switch, consisting of a diode made to conduct high currents under reverse bias by creating a large concentration of charge carriers (i.e. plasma) by optical excitation. The switch is off when the light is off and on when the light is on. However, the invention is primarily applicable to a switching operation in which the semiconductor device may be a switching device being optically triggered or a semiconductor device, such as a light-activated commutating diode, adapted to control a semiconductor switching device by light triggering, and the invention will therefore hereinafter be directed to these types of applications. There are two basic application areas where light control switches have been discussed and used. One is for power transmission and the other for very fast nano- to picosecond high power switching, for instance for controlling a pulse laser. Light-triggered HVDC (High Voltage Direct Current) thyristors having an active area of silicon have been developed during recent years, and they have a number of advantages over their electrically triggered counterparts. One of them has shorter turn-on times and lower turn-on losses due to improved initial turn-on area. Such a thyristor is described in a publication of P. Roggwiler, R. Sittig and F. Bernasconi, IEEE 1980 and is a part of a totally light-controlled switch, in which light-triggering is used to turn on a thyristor in the way defined in the introduction, and in which it is also possible to turn off the device using a light-triggered parallel commutating diode. To turn off a thyristor requires interruption of the self sustaining injection of charge at the emitter. This can be achieved by creating an alternative low impedance path for the current for a sufficient time to allow the thyristor to turn off. Optical excitation of a parallel commutating diode under reverse bias will allow the diode to conduct sufficient current during a long enough time to allow the thyristor blocking junction to recover and thus turn off the thyristor. The combination of the two above mechanisms allows the realization of a totally optically controlled switch, which is taught by said publication.

In known devices of this type the light emitting means have been constituted by optical fibres leading light to different spots of said active area. It was possible to use such a light emitting means for semiconductor devices having an active area of Si, since the bandgap of Si is comparatively low, but in the case of making such a semiconductor device with a SiC-layer having said active area it is not possible to use optical fibres for emitting light on said active area since the band gap of SiC is much higher than that of Si, so that blue light is needed for triggering a SiC-device, and such light is very much absorbed by the optical fibres. Accordingly, traditional concepts in the design of light-triggered semiconductor devices may not be useful for semiconductor devices of SiC. Another drawback of the use of optical fibres is the difficulty to obtain simultaneous, fast, and uniform coupling of light into the whole active area of a semiconductor device. This is due to the fact that the diameter of optical fibres is typically about 1 mm, whereas the device in question may have a diameter of more than 5 inches. Watanabe, Takahashi, Endo, Kakigi and Hashimoto have, in IEEE transactions on electron devices, Vol 37, No. 1, January 1990, proposed to speed up the light-triggering of a thyristor by arranging stripes leading from a central current well over the active area of the device. This does, however, not solve the problem of obtaining uniform coupling of light as described above.

SUMMARY OF THE INVENTION

The object of the present invention is to provide a semiconductor device comprising a semiconductor layer of SiC, which as defined in the introduction, has properties enabling excellent optical triggering thereof.

This object is in accordance with the invention, obtained by directly integrating said means in the device by placing it so as to cover substantial portions of said active area and making this by means of a Group 3B-nitride having a larger bandgap than the SiC of the SiC-layer.

Group 3B-nitrides are closely lattice-matched to SiC, so that they may be grown on SiC by using the epitaxial growth technique while obtaining layers thereof with a high crystalline quality, which is a condition for emission of light. Furthermore, Group 3B-nitrides are highly efficient emitters of electromagnetic radiation at appropriate photon energies for the triggering of SiC-devices. Accordingly, thanks to the close lattice match, a suitable light source can be directly incorporated at the active area of the device using epitaxial growth techniques. This is a totally new concept within the area of light-triggered semiconductor devices. As a result of this concept, the problem encountered before in using optical triggering, namely to achieve a uniform coupling of light into an appropriately designed light sensitive area of the device, is solved in a very advantageous way by covering substantial portions of the active area by the light emitting means in accordance with the invention. This allows the simultaneous turn-on of the whole area of the device due to uniform injection of the carriers that initiate the turn-on process. As a result of the plasma spreading responsible for turn-on losses and limiting the dI/dt (and the turn-on speed) may be eliminated. The same advantages are there for turning off the semiconductor device by optically triggering another semiconductor device, for instance a light-triggered, anti-parallel commutating diode, controlling the former, for instance a thyristor. The advantages of the proposed design also allow the realization of what is a new concept in high power switching devices, namely a simple rectifier made to conduct in the reverse bias direction by the application of light thereby forming the on-state of the device.

According to a preferred embodiment of the invention, the group 3B-nitride comprises a content of gallium. It has turned out that GaN with a possible addition of another Group 3B-element has a very high coupling efficiency with respect to SiC, i.e. a large percentage of the light is absorbed in the SiC-layer. GaN has a bandgap wider than the bandgap of all polytypes of SiC and such a Group 3B-nitride may be grown with a high crystalline quality, so that such a light emitter will be very efficient and fast.

According to another preferred embodiment of the invention, the Group 3B-nitride has at least in the region closest to the active area of the SiC-layer an Al content. By having Al as a content of the Group 3B-nitride, a high quality junction to the active area of the SiC-layer may be achieved since Al is the Group 3B-element that, alone with N in a nitride, has the closest lattice match to SiC. Furthermore, Al will tend to increase the bandgap of the Group 3B-nitride, so that it will be possible to increase the photon energy by increasing the content of Al in the Group 3B-nitride thereby increasing the penetration depth of the light in the SiC-layer. A decrease of the Al content will of course have the opposite effect.

According to another preferred embodiment of the invention, the region closest to the active area is made of AlN. As already mentioned, this makes it possible to obtain a high quality interface between the SiC-layer and the layer grown thereon, which will minimize different types of losses of the light emitted by the light emitting means due to traps near the interface.

According to another preferred embodiment of the invention, the region closest to the active area is made of $Al_{1-x}B_xN$, with x being less than 0.08. Such a small content of B in AlN improves the lattice matches to SiC and raises the quality of the interface further.

According to another preferred embodiment of the invention, the Group 3B-nitride has, starting from a certain distance from the SiC-layer, a content of Al decreasing in the direction away from said active area while a content of Ga increases in the same direction. In this way, it is be possible to generate light by said light emitting means at a certain distance from the SiC-layer while creating photons in the AlGaN- or GaN-layer thereby having a lower energy than the bandgap energy increasing in the direction of the SiC-layer avoiding absorption of the light on its way to the SiC-layer.

According to yet another preferred embodiment of the invention, the means is separated from the SiC-layer by an intermediate insulated layer of a Group 3B-nitride, and this Group 3B-nitride preferably has a bandgap larger than the bandgap of the Group 3B-nitride of said light emitting means, and it is very advantageous to use AlN as the material for the insulating layer. In this way, it is achieved that the light emitting means is separated from the active area of the semiconductor device by an insulating layer, so that a voltage may be applied to this light emitting means without disturbing the function of the semiconductor device. Also, the insulating layer will be of a high quality since it is of a Group 3B-nitride, which may be grown with a high quality on SiC, particularly in the case of AlN. The fact that this insulating layer has a larger bandgap than the material of the light emitting means has the advantage of no absorption of light as mentioned above.

According to another preferred embodiment of the invention, the light emitting means is a diode with a p- and a n-doped layers next to each other and a contact attached to each of these layers for applying a voltage thereto. Such a light emitting means in the form of a diode is easy to manufacture and has reliable function.

According to another preferred embodiment of the invention, the light emitting means is a semiconductor laser having an appropriate sequence of Group 3B-nitride layers. Such a light emitting means is in particular advantageous in the incorporation of such a laser for light triggering which will make higher power applications possible.

According to another preferred embodiment of the invention, the light emitting means is applied over the SiC-layer in an interdigitated fashion with respect to a contact electrode of the device applied on the SiC-layer. This way of covering substantial portions of said active area of the SiC-layer is very advantageous, and it will allow simultaneous injection of carriers over the whole area of the device, which initiates a turn-on process immediately in the case of a light emitting means on a switching device and the turn-off process when a commutating diode is influenced in the way described above. Thus, a uniform coupling of light into an appropriately designed light sensitive area is achieved.

Further advantages and preferred characteristics of the invention will appear from the following description and the other dependent claims.

BRIEF DESCRIPTION OF THE DRAWINGS

With reference to the appended drawings, a specific description of a preferred embodiment of the invention is cited as an example.

In the drawings.

DETAILED DESCRIPTION OF PREFERRED EMBODIMENTS OF THE INVENTION

Figure 1:
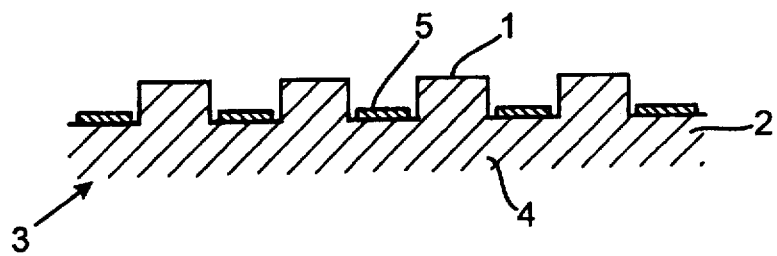
FIG. 1 is a very schematic, simplified cross-section view of a portion of a surface region of an optically triggered semiconductor device having a light emitting means placed thereon in an interdigitated fashion with respect to a contact electrode of the device.
Figure 2:
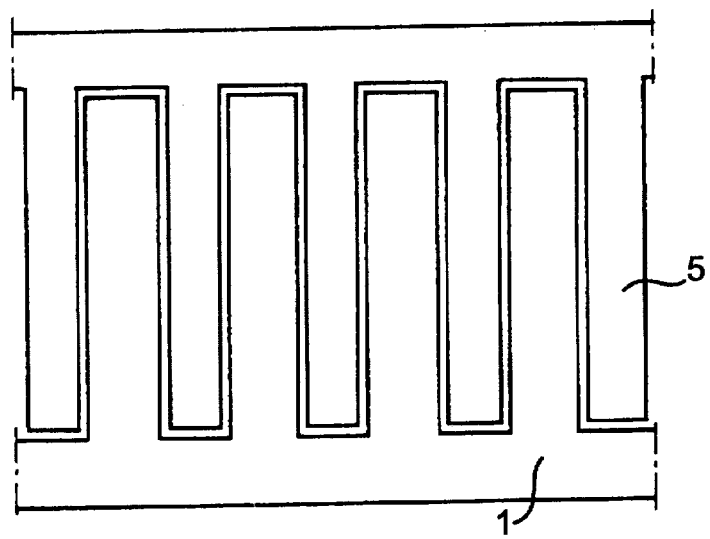
FIG. 2 is a view from above of the device according to FIG 1.

FIGS. 1 and 2 illustrate schematically and in a very simplified manner, how the light emitting means, the constitution and character of which will be described below, may be placed so as to cover substantial portions of an active area 2 of a semiconductor device 3. It has turned out to be very advantageous to accomplish this by applying the light emitting means over the active area 2 of the layer 4 of the device, which is of SiC, in an interdigitated fashion with respect to a contact electrode 5 of the device. By placing the light emitting means over substantial portions of the active area of the SiC layer of the device, this may be optically triggered in an advantageous way since there will be a uniform coupling of light into an appropriately designed light sensitive area. More exactly, it will allow the simultaneous turn-on over the whole area of the device due to uniform injection of the carriers that initiate the turn-on process. In this way, the plasma spreading, responsible for the turn-on losses and limiting the dI/dt (and turn-on speed), may be eliminated. The use of light to switch a reversed-biased diode into a conducting state is in itself a new kind of fast, high power switch that is realised by the design concept described here. As already mentioned above, it is also possible to use this type of light triggering to turn-off another device by, for example, making this light triggered device as an anti-parallel commutating diode used for turning off a thyristor.

Figure 3:
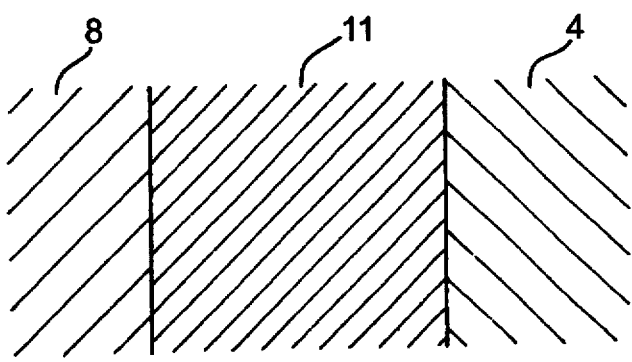
FIG. 3 is a view illustrating how a light emitting means may, according to the invention, be applied to a semiconductor device through an intermediate insulating layer being partially graded.
Figure 3:
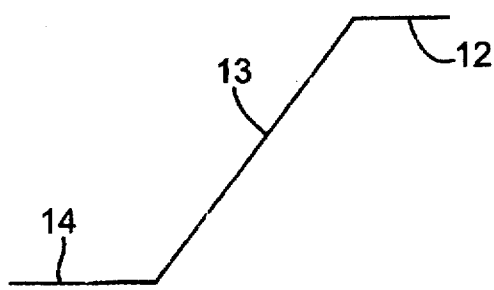
Figure 4:
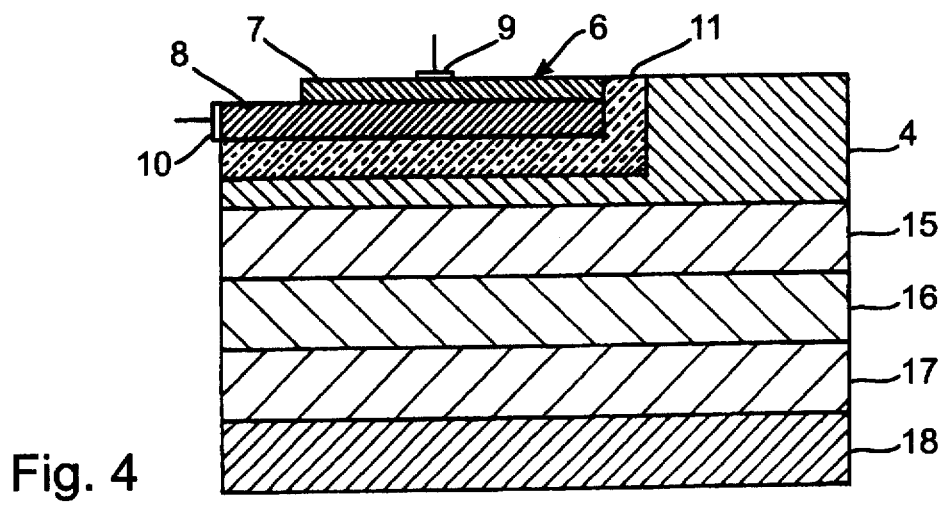
FIG. 4 is a section view illustrating a part of an optically triggered thyristor according to a first preferred embodiment of the invention.
Figure 5:
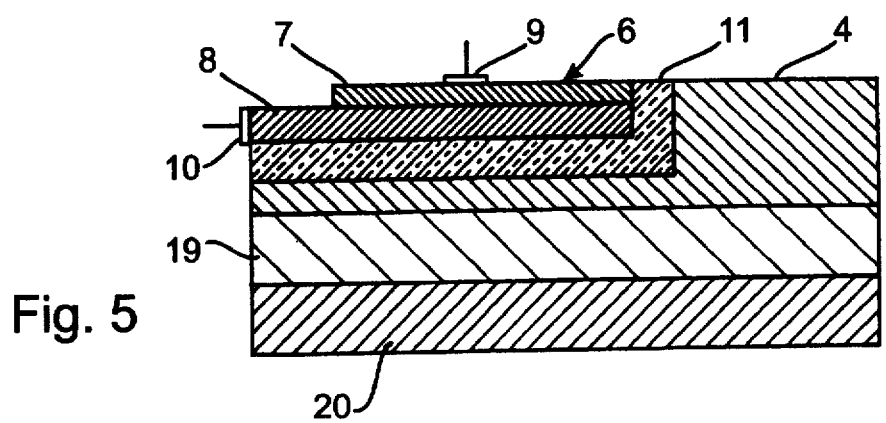
FIG. 5 is a section view of a part of an optically triggered diode according to a second preferred embodiment of the invention.

Reference is now made to FIG. 3 as well as to FIGS. 4 and 5. FIGS. 4 and 5 show how a light emitting means 6 in the form of a diode may be applied on a thyristor and a diode, respectively, for optical triggering in the sense defined in the introduction of this disclosure. These semiconductor devices are of SiC, or they have at least the layer having the active area to receive the photons from the light emitting means made of SiC.

The light emitting diodes 6 may be applied on the device in an interdigitated fashion as illustrated in FIGS. 1 and 2. It is emphasized that FIGS. 4 and 5 are partially sectioned and very simplified views of such a device which are intended only to be used for the sake of explaining the invention. The light emitting diode 6 has a first layer 7 of $n^+$-type and a second layer 8 of p-type, so a pn-junction is formed therebetween. Furthermore, it is illustrated by two contacts 9 and 10 that a voltage may be applied over the light emitting diode for the creation of photons.

The layers 7 and 8 are made of a Group 3B-nitride having a larger bandgap than the SiC of the SiC-layer 4. Such Group 3B-nitrides are more precisely closely lattice-matched to SiC, and they are known to be highly efficient emitters of electromagnetic radiation at photon energies, which will be appropriate for triggering SiC devices. The close lattice match implies that a suitable light source of this type can be directly incorporated at the active area of the device using epitaxial growth techniques.

The layers 7 and 8 of the light emitting diode are preferably made of GaN, possibly with a content of Al therein. GaN is very suitable as material for a light emitting diode for optically triggering a SiC-device, since it may be grown with a very high crystalline quality, which is a condition for the operation as a light emitting means, and the bandgap thereof is high enough for the creation of photons having a higher energy than the bandgap of SiC.

As mentioned, Al may be there as a component of a metal nitride, and by using such a ternary mixture of the metal nitride compound, the photon energy can be tuned to give the appropriate penetration depth in SiC asked for in a particular application. It is necessary that the light emitting diodes 6 are separated from the active area 2 of the semiconductor device by an insulating layer 11, and this insulating layer has to have a larger bandgap than the material of the light emitting means and have a high quality, so that a minimum of photons are absorbed by this layer.

It is also important that the interface between this layer 11 and the SiC-layer 4 is of a high crystalline quality and by that a minimum of traps. For this purpose, it is preferred that at least the region of the insulating layer 11 closest to said active area is made of AlN, since AlN has a very good lattice match to SiC, with a misfit of only 0.7%. Furthermore, AlN has a much larger bandgap than SiC and also than GaN or AlGaN, so that it will not absorb the light coming from the light emitting diode 6.

FIG. 3 illustrates how the concentration of Al in the insulating layer 11 may vary in a preferred way, and closest to the SiC-layer the insulating layer is made of purely AlN (12). Starting from a certain distance from the SiC-layer, the material is graded by a steady decrease of Al (13) while substituting it by Ga. From the interface between the second diode layer 8 and the insulating layer 11 the content of Ga and Al in the nitride will be constant (14). It is then still possible to have an Al content in the material, but it may also be zero. In this way, the diode may be epitaxially grown on the SiC-device with a high quality and it is avoided that light emitted from the diode is absorbed by the insulating layer 11. As an alternative, the AlN may, in the region 12 or in the part thereof closest to the SiC-layer, have a small content, less than 8% with respect to the content of N, of B, which will improve the lattice match to the SiC-layer and raise the quality of said interface further.

FIG. 4 illustrates an optically triggered thyristor in a simplified way. The thyristor has superimposed a first layer 4 of $n^+$-type for forming a good ohmic contact with an electrode not shown, a second p-type layer 15, a third $n^-$-type layer 16, a fourth p-type layer 17 and a fifth $p^+$-layer 18 for forming a good ohmic contact to an electrode not shown. The thyristor will be turned-on by the coupling of light from the light emitting diode 6 into an active area of the SiC-device.

FIG. 5 shows a diode which may be "optically triggered" or, better expressed, optically excited in a way explained below with reference to FIG. 6 by photons from the light emitting diode 6 arranged over an active area thereon. The diode, or at least the part thereon having said active area, is of SiC and comprises, superimposed, a first $n^+$-type layer 4, a second $n^-$-type layer 19 and a third $p^+$-type layer 20. All the layers 4, 19 and 20 in this device and the layers 4, 15–18 in the device according to FIG. 4 are preferably, but not necessarily, made of SiC. Only the layers 4 have to be of SiC.

Figure 6:
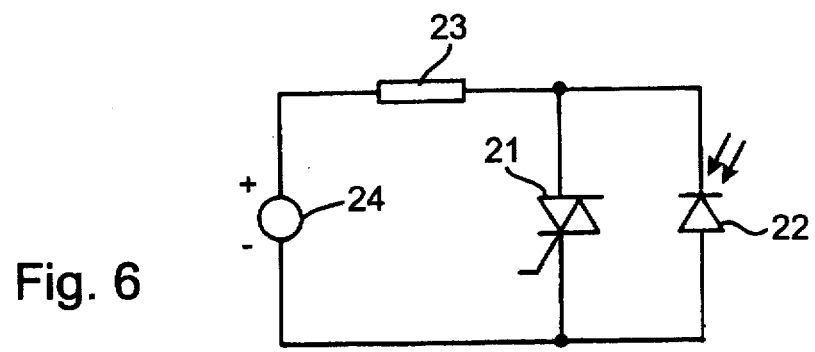
FIG. 6 is a view illustrating how in the prior art, a thyristor may be optically turned off.

FIG. 6 illustrates how a thyristor 21, which is preferably optically triggered by being constructed in accordance with FIG. 4, may be connected anti-parallelly to a diode 22, preferably of the type shown in FIG. 5. The circuit also has a resistance 23 and a voltage source 24. The thyristor may be turned on in the way already described. However, it is by this circuit also possible to turn off the thyristor 21 by using the light-triggered and parallel commutating diode 22. To turn off a thyristor the interruption of the self sustaining injection of charge at the emitter is required. This can be achieved by creating an alternative low impedance path for a the current for sufficient time to allow the thyristor to turn off. The optical excitation of the parallel commutating diode 22 under reverse bias allows the diode to conduct sufficient current during a long enough time to allow the thyristor blocking unction to recover and thus turn off the thyristor. Accordingly, such a device, as shown in FIG. 6, embodies a totally optically controlled switch.

The device according to FIG. 4 could be of importance for both HVDC and nano second switching, whereas the SiC diode with integrated light emitting diode according to FIG. 5 could be of importance for HVDC.

Figure 7:
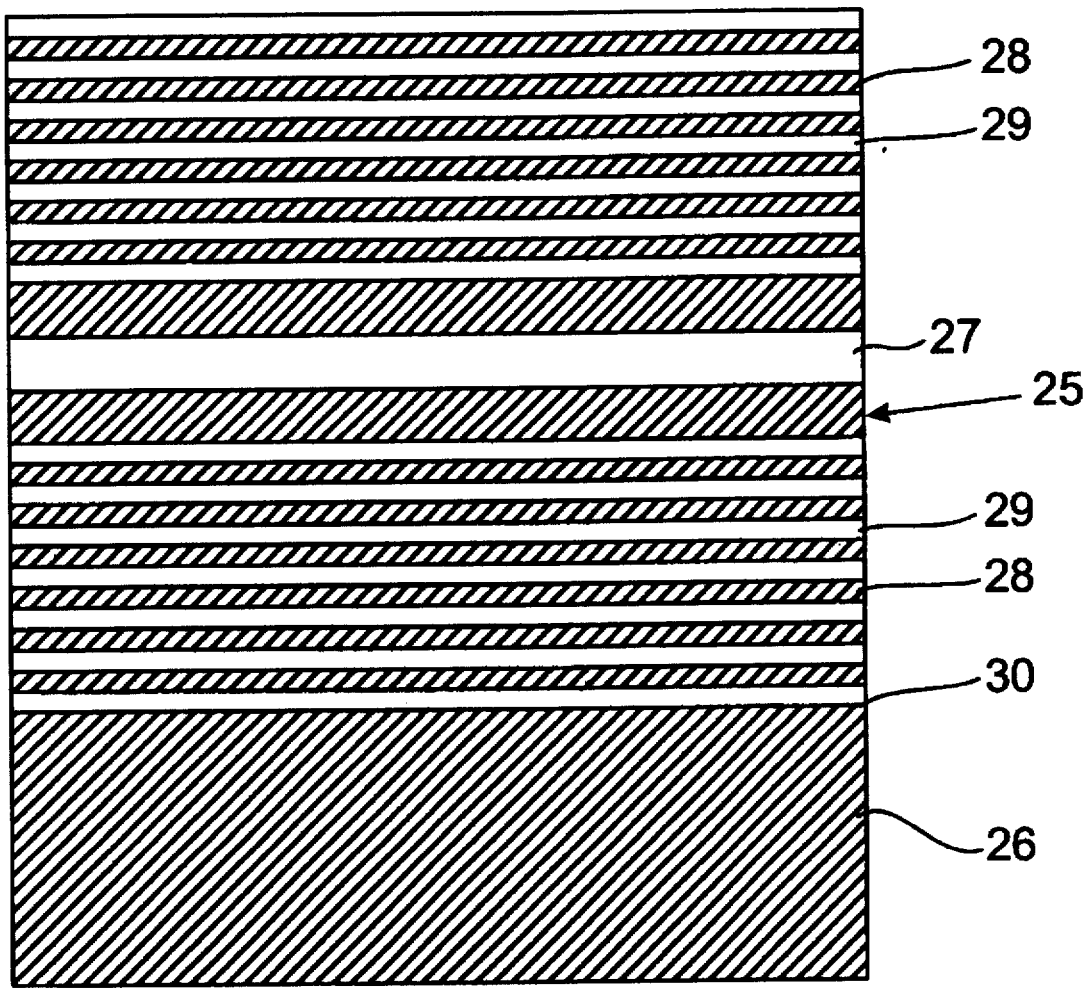
FIG. 7 is a schematic section view of a light emitting means in the form of a laser and an optically triggered semiconductor device thereunder.

FIG. 7 illustrates schematically how a light emitting means in the form of semiconductor laser 25 may be constructed in accordance with the invention to optically trigger a semiconductor switching device indicated by a SiC layer 26 thereof. This laser is a so called micro-cavity laser, which has an active region with a channel 27 in which light (photons) is created. On both sides, i.e. over and under, of this active region a plurality of alternating layers of Group 3B-nitrides are arranged. In this case, every second layer 28 is of AlGaN and every second layer 29 of AlN. The light created in the active channel region will penetrate through these sequences of layers and be partially reflected at the interface between such layers. The thickness of the layers is chosen so as to obtain interference. Thus, the layers over said active region channel 27 will act as an upper mirror and the layers thereunder as a lower mirror. The number Of layers in the upper mirror is so selected that 100% of the light will be reflected thereby, whereas the lower mirror may be arranged to reflect for instance only about 80% of the light coming from above. In this way light with a high intensity may be created over the entire surface 30 of the SiC layer 26 for uniformly and rapidly turning the semiconductor device in question on.

The invention is of course not in any way restricted to the preferred embodiments described above, but several possible modifications would be apparent to a man skilled in the art without departing from the basic idea of the invention as defined in the appended claims.

The light emitting means may be of another type than diodes, for instance a laser for higher power.

The definition "interdigitated fashion" in the patent claims is to be interpreted broadly and comprises all types of configurations in which the contact electrode and the light emitting means are in "engagement" with each other.

All definitions concerning the materials of the different device layers of course include inevitable impurities as well as intentional doping of the layers in question.

The definition layer is to be interpreted broadly and comprises all types of volume extensions and shapes.

The SiC-layer may be of any polytype of SiC, such as for example 6H, 4H, 3C and 15R.

It is evident that the different doped layers in devices according to the invention may have another order than shown in the preferred embodiments, so that for instance the light emitting diode may have a p-type layer on top of a n-type layer.

We claim:

1. A semiconductor device comprising a semiconductor layer of SiC having an active area through which the device is adapted to be triggered by light incident thereon and means for generating and emitting light with an energy exceeding the bandgap, being the energy difference between the conduction band and the valence band, of the SiC-layer of said active area, wherein said means is directly integrated in the device being located so as to cover substantial portions of said active area and being made of a Group 3B-nitride having a larger bandgap than that of the SiC of said SiC-layer.

2. A device according to claim 1, wherein said Group 3B-nitride comprises gallium.

3. A device according to claim 1, wherein said Group 3B-nitride contains Al at least in the region closest to said active area of the SiC-layer.

4. A device according to claim 3, wherein said region closest to said active area is made of AlN.

5. A device according to claim 3, wherein said region closest to said active area is made of $Al_{(1-x)}B_xN$, and wherein x is less than 0.08.

6. A device according to claim 1, wherein said Group 3B-nitride has, starting from a certain distance from the SiC-layer, a content of Al decreasing in the direction away from said active area, while the content of Ga increases in the same direction.

7. A device according to claim 1, wherein said means is separated from the SiC-layer by an intermediate insulated layer of a Group 3B-nitride.

8. A device according to claim 7, wherein the bandgap of the material of said insulating layer is larger than the bandgap of the Group 3B-nitride of said light emitting means.

9. A device according to claim 1, wherein said light emitting means is made of GaN.

10. A device according to claim 1, wherein said light emitting means is made of AlGaN.

11. A device according to claim 1, wherein said light emitting means emits light by creation of photons through excitation of charge carriers in said means upon application of a voltage thereover.

12. A device according to claim 1, wherein said light emitting means is a diode with a p- and an n-doped layer next to each other and a contact attached to each of said layers for applying a voltage thereover.

13. A device according to claim 1, wherein said light emitting means is a semiconductor laser having an appropriate sequence of Group 3B-nitride layers.

14. A device according to claim 1, wherein said device is a thyristor.

15. A device according to claim 1, wherein said light emitting means is integrated in a diode.

16. A device according to claim 1, wherein said the light emitting means is applied over the SiC-layer in an interdigitated fashion with respect to a contact electrode of the device applied on the SiC-layer.

* * * * *